(12) United States Patent
Ignaut (10) Patent No.: US 6,630,736 B1
(45) Date of Patent: Oct. 7, 2003

(54) LIGHT BARRIER FOR LIGHT SENSITIVE SEMICONDUCTOR DEVICES

(75) Inventor: Sharon L. Ignaut, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 123 days.

(21) Appl. No.: 09/627,043

(22) Filed: Jul. 27, 2000

(51) Int. Cl.$^7$ .............................................. H01L 23/48
(52) U.S. Cl. ....................................... 257/737; 257/738
(58) Field of Search ................................ 257/294, 435, 257/666, 678, 698, 734, 737, 738; 438/123, 124, 15

(56) References Cited

U.S. PATENT DOCUMENTS

| | | | |
|---|---|---|---|
| 3,969,751 A | * | 7/1976 | Drukaroff et al. |
| 4,622,576 A | * | 11/1986 | Buynoski |
| 4,853,755 A | * | 8/1989 | Okabe et al. |
| 5,384,480 A | * | 1/1995 | Naka et al. |
| 5,426,313 A | * | 6/1995 | Sukegawa et al. |
| 5,563,102 A | * | 10/1996 | Michael |
| 5,665,639 A | * | 9/1997 | Seppala et al. ............... 438/15 |
| 5,723,369 A | | 3/1998 | Barber |
| 5,902,686 A | * | 5/1999 | Mis |
| 6,069,066 A | * | 5/2000 | Huang et al. |
| 6,287,893 B1 | * | 9/2001 | Elenius et al. |

FOREIGN PATENT DOCUMENTS

| | | | |
|---|---|---|---|
| JP | 56040586 A | * | 4/1981 |
| JP | 64-42139 | * | 2/1989 |

OTHER PUBLICATIONS

Stanley Wolf, "Silicon Processing for the VLSI Era, vol. 2– Process Integration," 1990, Lattice Press, 1st edition, p. 273.*

Stanley Wolf and Richard Tauber, "Silicon Processing for the VLSI Era, vol. 1– Process Technology, " 2000, Lattice Press, 2nd edition, p. 870–871.*

Wolf, "Silicon Processing for the VLSI Era, vol. 2—Process Integration," 1990, Lattice Press, $1^{st}$ ed., p.273.*

(List continued on next page.)

*Primary Examiner*—Nathan J. Flynn
*Assistant Examiner*—Kevin Quinto
(74) *Attorney, Agent, or Firm*—Beyer Weaver & Thomas LLP (57) ABSTRACT

An integrated circuit package, and more particularly a surface mount device, is disclosed. The integrated circuit package includes at least a substrate (or wafer) and a light shield. The substrate has a substrate surface with an integrated circuit formed thereon. The integrated circuit includes light sensitive areas, which are adversely affected by ambient light. The light shield is disposed over the light sensitive portions to block ambient light from reaching the light sensitive portions of the circuit so that the electrical characteristics of the circuit are not significantly altered when the circuit is operated in ambient light. The integrated circuit package also includes a plurality of bond pads disposed on the substrate surface and a first passivation layer disposed between the bond pads and the light shield and between the substrate surface and the light shield. The light shield is arranged to extend over an edge of the bonding pad. Further still, the integrated circuit package includes a second passivation layer disposed over the light shield such that the light shield is disposed between the first and second passivation layers. The passivation layers and the light shield define openings above each of the plurality of bond pads that allow an upper bump pad to be disposed on the bonding pads, and a solder bump to be disposed on the upper bump pad. The solder bumps are used to couple the integrated circuit to a substrate such as a printed circuit board.

47 Claims, 9 Drawing Sheets

OTHER PUBLICATIONS

Wolf and Tauber, "Silicon Processing for the VLSI Era, vol. 1—Process Technology," 2000, Lattice Press, $2^{nd}$ ed., p.870–871.*

Streetman, "Solid State Electronic Devices," 1990, Prentice–Hall, third edition, p.371.*

Trybula and Trybula, "Surface Mount Technology," posted at http://www.mrw.interscience.wiley.com/eeee/16/2116/W.2116–1.html on Dec. 27, 1999 on the Wiley Encyclopedia of Electrical and Electronics Engineering page by John Wiley & Sons, Inc.*

Wolf, "Silicon Processing for the VLSI Era, vol. 2—Process Integration," 1990, Lattice Press, 1st ed., p.273–274.*

* cited by examiner

LIGHT BARRIER FOR LIGHT SENSITIVE SEMICONDUCTOR DEVICES

BACKGROUND OF THE INVENTION

The present invention pertains to semiconductor integrated circuits, and more particularly to light sensitive integrated circuits and to surface mount structures that exclude ambient light.

The manufacturing process for making integrated circuit chips is performed, not on individual integrated circuit chips, but rather on semiconductor wafers. At the present state of the art many thousands of integrated circuits may be formed on a silicon wafer whose diameter is between about 6 inches to about 12 inches. Each chip is a structure that includes one or more layers of insulator, conductor and semiconductor, each layer being patterned according to a mask, which defines the circuitry on the chip. Bonding pads are also formed on the surface of the wafer, and thus each of the chips, to provide contacts for input signals, output signals, supply voltage, and ground. In the manufacture of certain types of chips, for example some surface mount device packages, an elevated bump is formed on the bonding pads. Typically, these raised bumps are solder bumps that are used to connect the chip to a substrate such as a printed circuit board. After the wafer is fabricated, each of the integrated circuit chips is separated from the wafer in a dicing or singulation procedure to form separate integrated circuit chips. After separation, each integrated circuit chip is individually packaged and attached to an associated substrate by bringing the solder bumps into contact with metal traces on the substrate and then, in one operation, reflowing the solder bumps so as to permanently attach solder bumps to traces.

Conventionally, after the solder bumps are electrically coupled to the contacts of the substrate, an underfill layer is injected between the substrate and the surface mount device and around the solder bump of the surface mount device. The underfill material is selected for its mechanical properties so that it redistributes the mechanical and thermomechanical stresses arising between the device and the substrate. That is, the underfill protects the device from mechanical damage. Unfortunately, however, the formation of this underfill layer results in an extra process step and an expenditure of man-hours and associated costs for the conventional surface mount device. As such, another approach for protecting the device has been to apply a resilient protective layer to the semiconductor wafer before the solder bumps are formed. After the surface mount device has been attached to a substrate, the resilient protective layer protects the solder bumps and active regions of the device from mechanical damage arising from mechanical and thermo-mechanical stresses arising between the device and the substrate. The resilient layer provides protection against mechanical damage while avoiding the use of underfill. By eliminating the underfill, significant costs associated with the injection of underfill may be avoided. Furthermore, when a resilient protective layer is used, the device may not be fully encapsulated, as compared with many conventional surface mount packages. As a result, the overall size and costs of the device may be reduced.

Although the resilient protective layer works well, there are continuing efforts to improve devices that use them. For example, because the resilient coating is generally transparent and no underfill is used, the circuit side of the surface mount device is exposed to whatever ambient light enters the space between the device and the substrate. Furthermore, because the surface mount device is not fully encapsulated, the sides of the surface mount device are also exposed to ambient light. Ambient light includes natural daylight and lamplight. As a result, the transparent resilient coating and the exposed sides of the device can cause a path for ambient light to enter the active regions of the circuit. Some circuits can operate satisfactorily in ambient light. However, some other circuits are so sensitive to ambient light that their electrical characteristics are altered to an unacceptable degree. More particularly, the introduction of light can result in unwanted leakages in regions that would influence the performance of the device. As such, these light sensitive circuits must be isolated from ambient light. Thus a need exists for protecting surface mount devices, which are not fully encapsulated or which are protected by a transparent material, from ambient light.

SUMMARY OF THE INVENTION

To achieve the foregoing and other objects of the invention, methods and devices for minimizing the effect of ambient light introduced to integrated circuits are described. The invention pertains to an integrated circuit package, and more particularly to a surface mount device, that includes a light shield for preventing light from entering therein. The invention is particularly useful for surface mount devices that are not fully encapsulated or for surface mount devices that have a resilient outer coating that is formed from a transparent material. In accordance with the present invention, the light shield is disposed between two passivation layers, and is formed by covering light sensitive portions of the integrated circuit die with a light barrier layer that is opaque to ambient light. By covering the light sensitive portions of the integrated ciruit, ambient light is prevented from adversely effecting the active regions of the circuit.

The invention relates, in one embodiment, to an integrated circuit package that includes a substrate (or wafer), a bonding pad and a light shield. The substrate has a substrate surface with active regions formed thereon. The active regions generally include light sensitive portions, which are adversely affected by ambient light. The bonding pads are disposed over the substrate surface to provide contacts for input signals, output signals, supply voltage, and ground. Furthermore, the light shield is disposed over a portion of the bonding pad and over a portion of the substrate surface. The light shield is formed from a light barrier layer that is opaque to ambient light. The purpose of the light shield is to block ambient light from reaching the active regions, and more particularly, to block ambient light from reaching the light sensitive portions, which are adversely affected by ambient light. In most configurations, the light shield is arranged to extend over an edge of the bonding pad to block light from entering therebetween.

In some embodiments, the light shield is formed from a non-conductive material. In other embodiments, the light shield is formed from a conductive material. In a related embodiment, the conductive light shield is electrically grounded to prevent the formation of an electrical potential on the light shield. In other embodiments, the light shield is electrically floating.

In another embodiment, the integrated circuit package includes a first passivation layer disposed between the light shield and the substrate surface and between the light shield and the bonding pad. In some embodiments, the first passivation layer is formed from a single layer. In other embodiments, the first passivation layer is formed from a combination of layers including a top layer and a bottom layer. By way of example, the bottom layer may be formed from a vapox over metal layer and the top layer may be formed from a nitride layer. In some embodiments, the light shield is disposed between the top layer and the bottom layer such that the bottom layer is disposed over the substrate surface and the bonding pad, and the top layer is disposed over the light shield. In a related embodiment, the light shield is arrange to extend over a side portion of the first passivation layer, or the bottom layer, to prevent light from entering through the sides of the passivation layer.

In another embodiment, the integrated circuit package includes a second passivation layer disposed over the light shield. As such, the light shield is disposed between the first and second pasivation layers. The second passivation layer, which acts as resilient protective layer, is arranged to protect the underlying layers from thermal, chemical, electrical and mechanical stresses.

In another embodiment, the passivation layers and the light shield define openings above each of the plurality of bonding pads that allow an upper bump pad to be disposed on the bonding pads (albeit not contacting the light barrier layer), and a solder bump to be disposed on the upper bump pad. The solder bumps are used to couple the integrated circuit of the integrated circuit package to an external substrate such as a printed circuit board.

BRIEF DESCRIPTION OF THE DRAWINGS

The present invention may best be understood by reference to the following description taken together with the drawings. The drawings are not to scale.

DETAILED DESCRIPTION OF THE INVENTION

Methods, techniques and devices associated with the present invention will now be described in detail with reference to a few preferred embodiments thereof and as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

Figure 1:
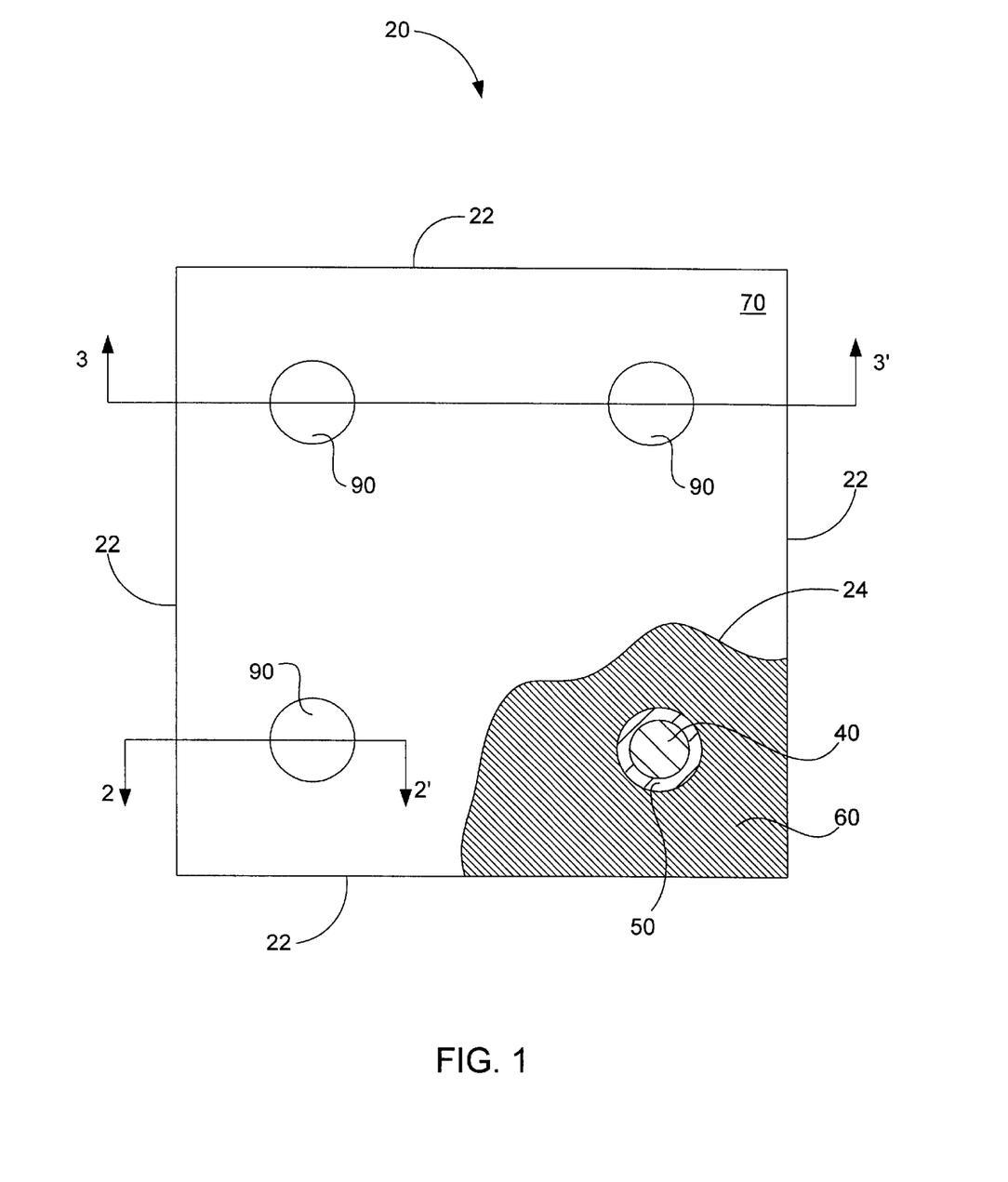
FIG. 1 is a plan view of a surface mount device, in accordance with one embodiment of the present invention.

FIG. 1 is a plan view of the top surface of an un-encapsulated surface mount device 20, in accordance with one embodiment of the present invention. The surface mount device 20 is shown after it has been cut from a semiconductor wafer (not shown). The surface mount device 20 generally includes a plurality of solder bumps 90 and a resilient outer coating 70. The solder bumps 90 are adapted to electrically couple the integrated circuit of the surface mount device 20 to an external substrate such as a printed circuit board. Although only four solder bumps are shown, it should be understood that the amount of solder bumps may vary according to the specific design of each surface mount device. Furthermore, the resilient outer coating 70, which extends to about an outer peripheral edge 22, is adapted to protect the underlying layers of the surface mount device 20 from chemical, mechanical, electrical, and thermal stresses.

As shown, a portion 24 of the surface mount device 20, including a portion of the resilient outer coating and a solder bump, has been removed in order to show the underlying layers of the surface mount device 20. Some of the underlying layers include a bonding pad 40, a passivation layer 50 and a light barrier layer 60. The passivation layer 50 generally defines the outer peripheral edge 22. In the illustrated embodiment, the light barrier layer 60, which also extends to the outer peripheral edge 22, is disposed between the resilient outer coating 70 and the passivation layer 50. The light barrier layer 60 is arranged to form a light shield that blocks light from reaching light sensitive portions of the underlying integrated circuit. Although the resilient outer coating 70 and the light barrier layer 60 are shown and described as extending to the outer peripheral edge 22, it should be noted that this is not a limitation. For example, in some cases, the resilient outer coating 70 is arranged to extend to positions inside of the outer peripheral edge 22, while in other cases, the light barrier layer 60 is arranged to extend to positions outside of the outer peripheral edge 22.

Figure 2:
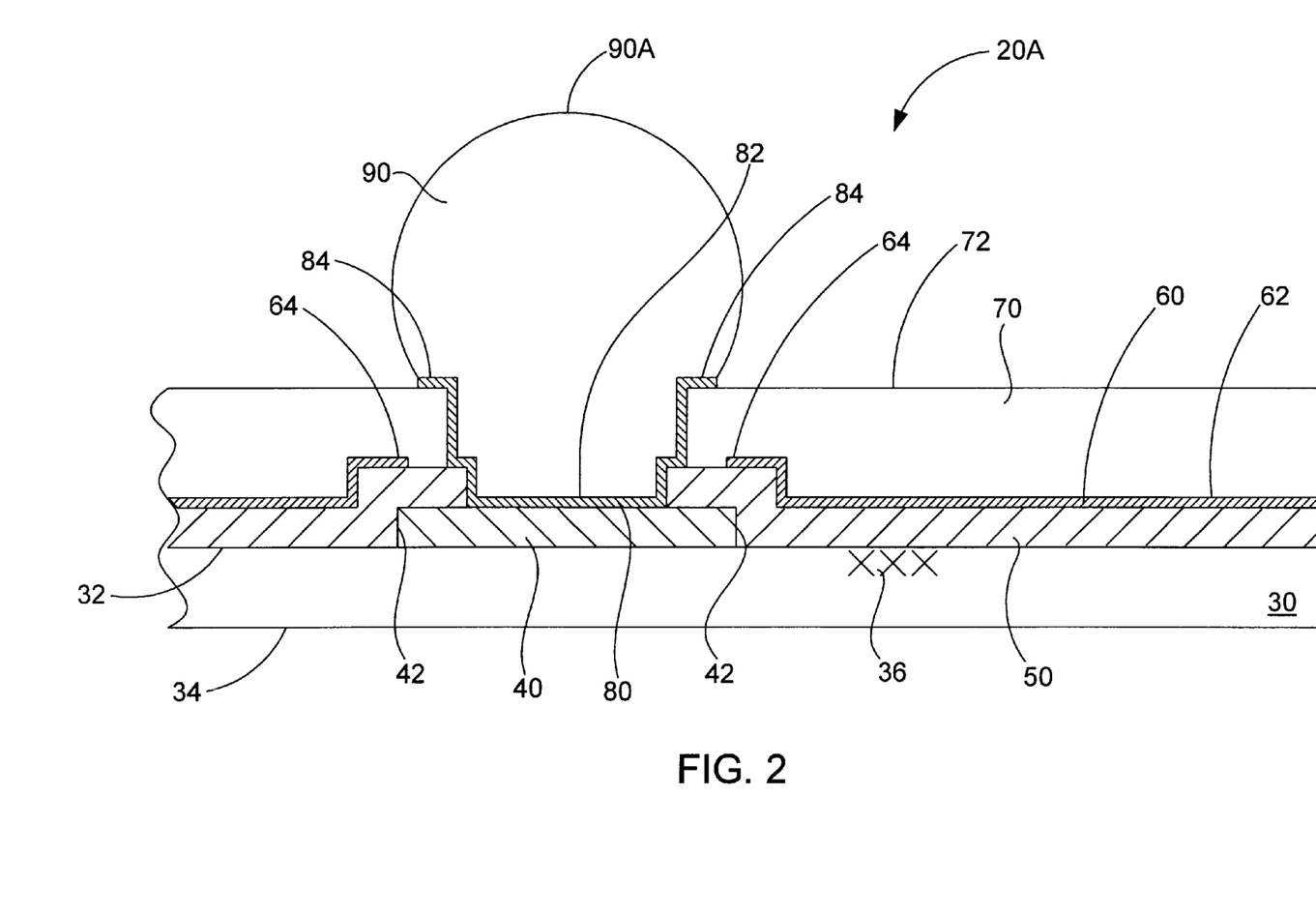
FIG. 2 is a side elevation view, in cross section (taken along 2–2' as indicated in FIG. 1), of the surface mount device, in accordance with one embodiment of the present invention.

FIG. 2 is a side cross section view (taken along line 2–2' as indicated in FIG. 1) of a surface mount device 20A (not drawn to scale), in accordance with one embodiment of the present invention. As shown, the surface mount device 20A includes a plurality of layers including a wafer 30, a bonding pad 40, a first passivation layer 50, a light barrier layer 60, a resilient coating or second passivation layer 70, an under bump layer 80, and a solder bump 90. In one embodiment, some of the layers, including the bonding pad 40, the first passivation layer 50, the light barrier layer 60 and the second passivation layer 70, are formed in a wafer fab, while other layers, including the under bump layer 80 and the solder bump 90 are formed in a bump fab. It should be understood, however, that this is not a limitation and that the fabrication process may vary according to the specific design of each surface mount device. By way of example, the layers may be formed during the same fabrication process, for example, in a bump fab.

Although not shown in this illustration, it should be understood that layers of insulator, conductor and semiconductor, which form the active regions of the integrated circuit, are generally formed on the surface of the wafer and between the wafer and portions of the bond pad and the first passivation layer. By way of example, the active regions may include transistors, interconnects, capacitors, resistors and the like. For ease of discussion, the term "wafer surface" herein includes these layers, which are not shown, as well as, the surface of the wafer. As such, the wafer surface is generally designated 32, and the bottom surface, which is opposite the wafer surface 32 and conventionally left bare or exposed, is generally designated 34. Although the bottom surface 34 is exposed, it should be noted that in some embodiments, the bottom surface may be covered with a resilient coating. Furthermore, the wafer 30 is a portion of the semiconductor wafer from which the surface mount device 20 is cut, and may be a wafer of any suitable material, including any suitable semiconductor material.

As shown in FIG. 2, the bonding pad 40 is disposed over select areas of the wafer surface 32. The bonding pad 40 is formed by depositing a conductive layer over the wafer surface 32 and then selectively etching the layer. The bonding pad 40 is arranged to provide contacts for input signals, output signals, supply voltage, and ground. The bonding pads may be formed of any suitable conductive material or any combination of conductive materials. By way of example, conductive materials such as aluminum, copper, and/or silicon may be used. In one implementation, the bonding pad 40 is a layer of aluminum having a thickness between about 5,000 angstroms to about 20,000 angstroms. Bonding pads and their implementations are well known to those skilled in the art, and therefore will not be discussed in great detail here.

The first passivation layer 50 is disposed over the wafer surface 32 and over a portion of the bonding pad 40. The first passivation layer 50 is formed by depositing a suitable dielectric material over the wafer surface 32 and over the surface of the bonding pad 40 and then selectively etching the layer to form openings above the bonding pad 40. The openings are arranged to provide access to the bonding pad 40 through the first passivation layer 50. Generally speaking, the first passivation layer 50 serves to protect the underlying structures of the integrated circuit. By way of example, the first passivation layer 50 may be formed from a Vapox Over Metal (VOM) layer and/or a nitride layer. A VOM layer tends to provide a cushion between the underlying layers and any layers, which are subsequently deposited over the VOM layer, and a nitride layer tends to provide a barrier for moisture. VOM layers and nitride layers are well known in the art and for the sake of brevity will not be discussed in greater detail. In some embodiments, the first passivation layer 50 is a single layer, and in other embodiments, the first passivation layer 50 is a combination of layers. A combination of passivation layers may be needed to provide good adhesion between the underlying layers and any layers that are subsequently deposited over the first passivation layer 50.

The light barrier layer 60 is disposed over the first passivation layer 50. The light barrier layer 60 is formed by depositing a suitable light blocking material over the surface of the first passivation layer 50 and over the surface of the bonding pad 40 and selectively etching the layer to form light shield 62. As shown in FIG. 2, the light shield 62 is positioned so as to block ambient light from reaching light sensitive portions 36 of the integrated circuit. Similarly to the passivation layer 50, an opening is formed in the light barrier layer 60 over the bonding pad 40 to provide access to the bonding pad 40 through the light barrier layer 60. By way of example, light blocking materials such as Al, Ti, TiW, and TiN having a thickness in the range of approximately 1500 Angstroms to 4000 Angstroms may be used to form the light shield 62. It should be noted, however, that this is not a limitation and that any light absorbing or light reflecting material, whether conductive or non-conductive, may be used. For example, materials such as copper, epoxy, polyimide are also suitable for forming the light barrier layer 60. Furthermore, the thickness of the light barrier layer may vary according to the specific material chosen and the specific needs of each surface mount device.

As should be appreciated, if a space is left between the edges of the bonding pad and the light shield, then ambient light may reach the light sensitive portions of the integrated circuit. In addition, the space between the bottom surface of the light shield and the top surface of the bonding pad may also allow access for light, which is reflected off of the upper bump layer, to reach the light sensitive portions of the integrated circuit. Therefore, in one embodiment, a portion of the light shield is arranged to overlap a portion of the bond pad in order to block light that may enter between them. This embodiment is particularly advantageous to further prevent light from reaching the light sensitive portions of the integrated circuit.

Referring to FIG. 2, an inner edge 64 of the light shield 62 is configured to extend over an outer edge 42 of the bonding pad 40. A small amount of overlap is generally sufficient to prevent the passage of light between the light shield and the bonding pad. As a general rule, however, the greater the overlap (from edge 64 to edge 42), the greater the amount of light blocked. For example, although both a small and a large overlap will prevent incident light from reaching the light sensitive portions of the circuit, a large overlap tends to provide increased protection against light that is reflected off of the sides of upper bump layer. Some factors that may effect the amount of overlap are the size of the bonding pad 40, and the distance between the light shield 62 and the upper bump layer 80. For example, a short may occur between the light shield 62 and the upper bump layer 80 if the distance between them is too small. The distance may vary according to the size and specific needs of each surface mount device. For example, if the voltage through the solder ball is small then the distance can be small, and if the voltage through the solder bump is large then the distance should be large.

Furthermore, the second passivation layer 70 is disposed over the light barrier layer 60 and a portion of the first passivation layer 50. Thus, the light shield 62 is disposed between the first passivation layer 50 and the second passivation layer 70. The second passivation layer 70 is formed by depositing a suitable dielectric material over the surface of the light barrier layer 60, over a portion of the first passivation layer 50, and over the bonding pad 40 and then selectively etching the layer to form a resilient protective shield 72. An opening is also formed in the second passivation layer 70 over the bonding pad 40 to provide access to the bonding pad 40 through the second passivation layer 70. Furthermore, the second passivation layer 70 is arranged to cover and surround the edge 64 of the light shield 62. Thus, a portion of the second passivation layer 70 is disposed between the light shield 62 and the upper bump layer 80. As should be appreciated, the distance between the light shield 62 and the upper bump layer 80 is based at least in part on the type of material selected for the second passivation layer 70. That is, certain materials are better suited for preventing shorts, and therefore they may be used to allow for a larger overlap.

The second passivation layer 70 is arranged to protect the underlying layers from thermal, chemical, electrical and mechanical stresses. For example, the second passivation layer 70 may be used to protect the surface mount device 20 from damage arising from mechanical and thermomechanical stresses which occur during mounting of the device to an external substrate such as a printed circuit board. By way of example, resilient insulating materials such as polyimides and/or benzocyclobutene (BCB) may be used. Benzocyclobutene (BCB) has the advantage that it can be patterned directly without the use of an additional photoresist layer. Furthermore, the second passivation layer 70 should have a thickness that is suitable for absorbing stresses (i.e., should be thick enough to provide a large enough cushion so that the stresses do not damage the active regions of the chip), and that is not prohibitively expensive to fabricate.

The under bump layer 80 is disposed at least over the second passivation layer 70 and over the exposed portion of the bonding pad 40. As shown, the under bump layer 80 may also be disposed over a portion of the first passivation layer 50. The under bump layer 80 is formed by depositing a suitable conductive material over the surface of the second passivation layer 70 and over the surface of the bonding pad 40 and then selectively etching the layer to form an under bump pad 82 on each bonding pad 40. As shown, under bump pad 82 may extend over a portion of the second passivation layer 70 to form a lip 84 around the corner of the opening. The lip 84 provides further protection against mechanical damage, as well as further protection against unwanted ambient light. Furthermore, a solder bump 90 is formed on the under bump pad 82 using conventional solder bumping or balling techniques. The solder bumps 90 are adapted to electrically couple the integrated circuit of the surface mount device 20 to an external substrate such as a printed circuit board. As should be appreciated, solder bump 90, under bump pad 82, and bonding pad 40 form electrical terminal 90A.

The solder bump 90 is generally formed from a eutectic solder material such as lead and tin. The under bump layer 80 may be formed of any suitable conductive material that provides good adhesion between the bonding pad 40 and the solder bump 90, and may include a plurality of layers. By way of example, materials such as aluminum, nickel, nickel-vanadium, copper, chromium, copper-chromium may be used.

Figure 3:
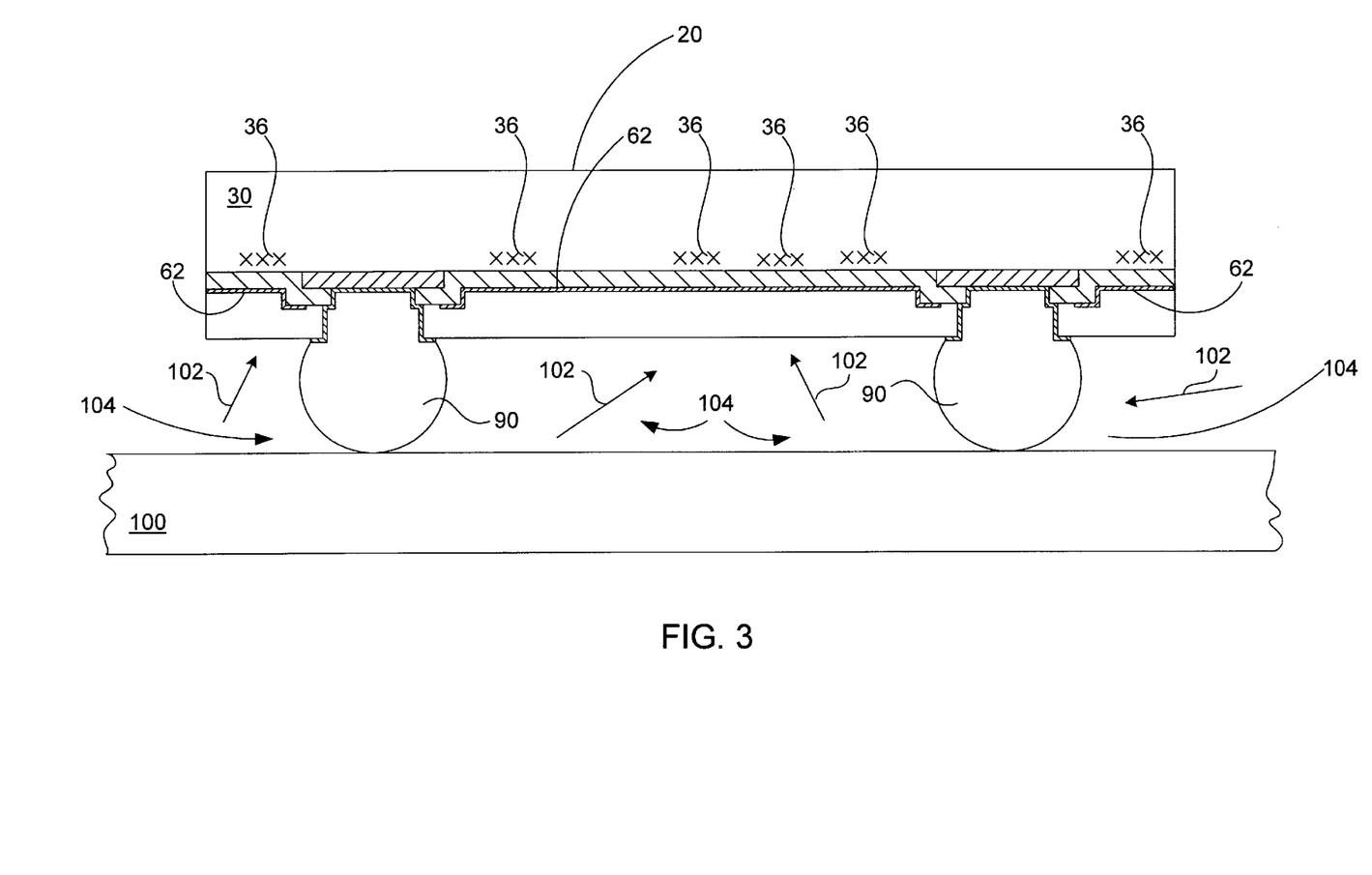
FIG. 3 is a side elevation view, in cross section (taken along 3–3' as indicated in FIG. 1), of the surface mount device attached to an external substrate, in accordance with one embodiment of the present invention.

FIG. 3 is a side elevation view, in cross section (taken along line 3–3' as indicated in FIG. 1) of the surface mount device 20 mounted to an external substrate 100 (i.e., circuit board), in accordance with one embodiment of the present invention. As stated previously, the surface mount device 20 includes a wafer 30, solder bumps 90 and light shield 62. The solder bumps 90 are attached to conductive traces (not shown) on the external substrate 100 and thus the surface mount device 20 is structurally and electrically attached to the external substrate 100. As shown, ambient light 102 (whether natural/artificial or incident/reflected) is free to enter the space 104 between the substrate 100 and the surface mount device 20. Because the light shield 62 is opaque to ambient light it prevents light 102 from penetrating to the light sensitive portions 36 of the surface mount device 20. Accordingly, the electrical characteristics of the surface mount device 20 are not significantly changed by ambient light 102.

Referring now to FIGS. 4–7, several embodiments of the present invention will be described in detail.

Figure 4:
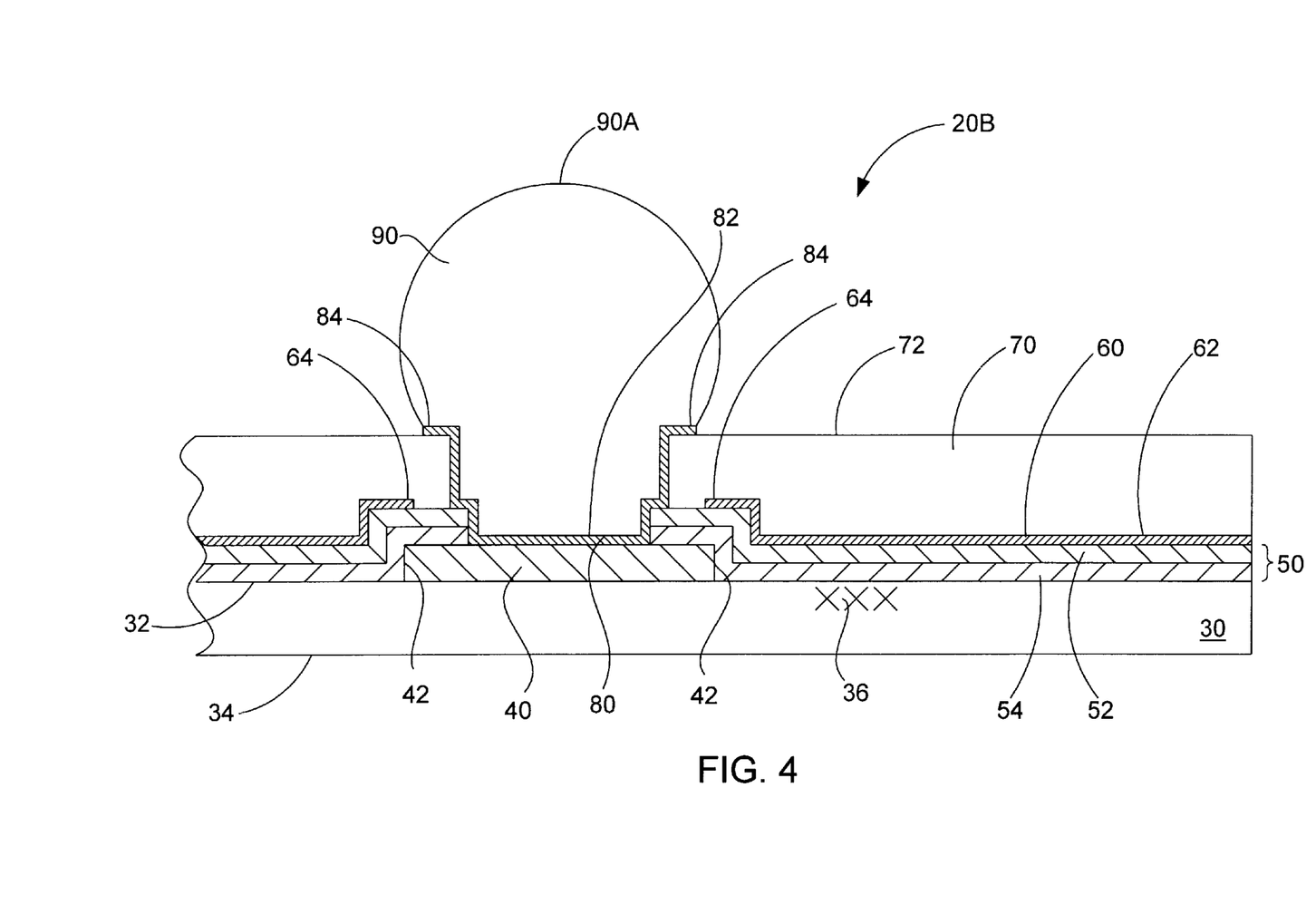
FIG. 4 is a side elevation view, in cross section (taken along 2–2' as indicated in FIG. 1), of the surface mount device, in accordance with one embodiment of the present invention.

FIG. 4 is a side cross section view (taken along line 2–2' as indicated in FIG. 1) of a surface mount device 20B (not drawn to scale), in accordance with another embodiment of the present invention. In this embodiment, the surface mount device 20B is similar to the invention set forth above with regards to FIGS. 1–3. Thus, the surface mount device 20B includes a wafer 30, a bonding pad 40, a first passivation layer 50, a light barrier layer 60, a second passivation layer 70, an under bump layer 80, and a solder bump 90. In accordance with this embodiment, the first passivation layer 50 is formed from a plurality of layers, and more particularly two layers. As such, the first passivation layer 50 includes a top layer 52 and bottom layer 54.

As shown in FIG. 4, the bonding pad 40 is disposed over select areas of the wafer surface 32. The bonding pad 40 is formed by depositing a conductive layer over the wafer surface 32 and then selectively etching the layer. The first passivation layer 50 is disposed over a portion of the bonding pad 40 and over the wafer surface 32. In the illustration shown, the first passivation layer 50 is a combination of a bottom layer 54 and a top layer 52, and thus, the bottom layer 54 is disposed over the wafer surface 32 and over a portion of the bonding pad 40, and the top layer is disposed over the bottom layer 54. The bottom layer 54 is formed by depositing a suitable dielectric material over the substrate surface and the bonding pad and then selectively etching the layer to form an opening above the bonding pad 40. The top layer 52 is formed by depositing a suitable dielectric material over the bottom layer and then selectively etching the layer to form an opening above the bonding pad 40. The openings are arranged to provide access to the bonding pad 40 through layers 52, 54. In some processes, the bottom layer 54 is a VOM layer having a thickness between about 5,000 angstroms and about 15,000 angstroms, and the top layer is a nitride layer having a thickness between about 5,000 angstroms and about 15,000 angstroms. It should be appreciated, however, that the thickness range given herein is not a limitation and that the thickness may vary according to the specific design of each surface mount device. In addition, it should be noted that this particular implementation is not a limitation and that the layers may be formed from other suitable materials.

Furthermore, the light barrier layer 60 is disposed over the top layer 52. The light barrier layer 60 is formed by depositing a suitable light blocking material over the surface of the top layer 52 and over the surface of the bonding pad 40 and selectively etching the layer to form light shield 62. As shown in FIG. 4, the light shield 62 is positioned so as to block ambient light from reaching light sensitive portions 36 of the integrated circuit. The light shield 62 includes an edge 64 arranged to extend over an outer edge 42 of the bonding pad 40 to prevent light from penetrating between the edges of the two layers. An opening is also formed in the light barrier layer 60 over the bonding pad 40 to provide access to the bonding pad 40 through the light barrier layer 60. Moreover, the second passivation layer 70 is disposed over the light shield 62 and over a portion of the top layer 52. Thus, the light shield 62 is disposed between the top layer 52 and the second passivation layer 70. The second passivation layer 70 is formed by depositing a suitable dielectric material over the light shield 62, over select areas of the top layer 52 and over the bonding pad 40 and then selectively etching the layer to form a resilient protective shield 72. An opening is formed in the second passivation layer 70 over the bonding pad 40 to provide access to the bonding pad 40 through the second passivation layer 70. As shown, the second passivation layer 70 is arranged to surround the edge 64 of the light shield 62. The second passivation layer 70 is arranged to protect the underlying layers from thermal, chemical, electrical and mechanical stresses. Additionally, the under bump layer 80 is disposed at least over the second passivation layer 70 and over the exposed portion of the bonding pad 40. As shown, the under bump layer 80 may also be disposed over a portion of the top layer 52. The under bump layer 80 is formed by depositing a suitable conductive material over the surface of the second passivation layer 70 and over the surface of the bonding pad 40 and then selectively etching the layer to form an under bump pad 82 on each bonding pad 40. As shown, under bump pad 82 may extend over a portion of the second passivation layer 70 to form a lip 84 around the comer of the opening. The lip 84 provides further protection against mechanical damage, as well as further protection against unwanted ambient light. Furthermore, a solder bump 90 is formed on the under bump pad 82 using conventional solder bumping or balling techniques. The solder bumps 90 are adapted to electrically couple the integrated circuit of the surface mount device 20 to an external substrate such as a printed circuit board. As should be appreciated, solder bump 90, under bump pad 82, and bonding pad 40 form electrical terminal 90A.

Figure 5:
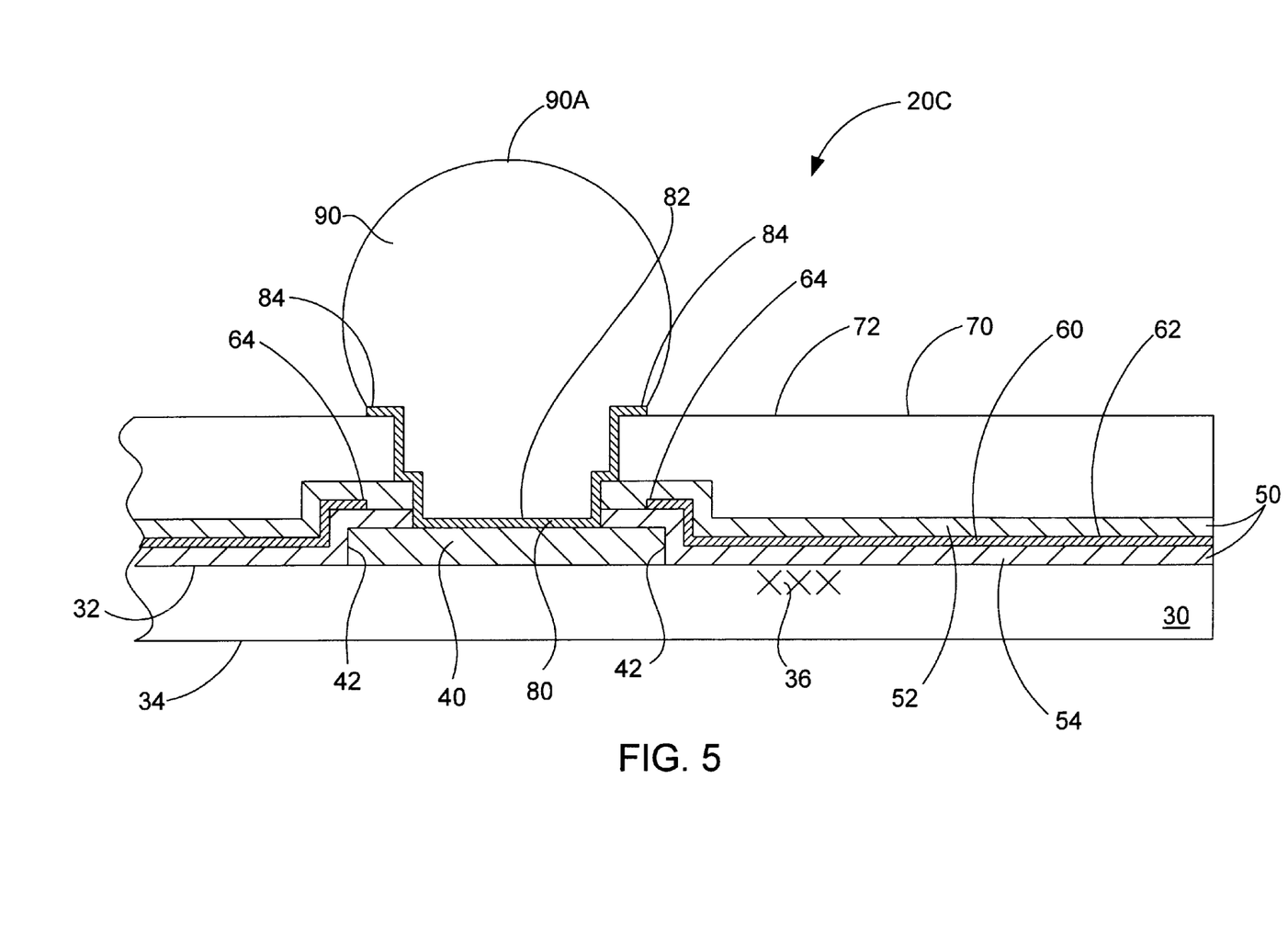
FIG. 5 is a side elevation view, in cross section (taken along 2–2' as indicated in FIG. 1), of the surface mount device, in accordance with one embodiment of the present invention.

FIG. 5 is a side cross section view (taken along line 2–2' as indicated in FIG. 1) of a surface mount device 20C (not drawn to scale), in accordance with another embodiment of the present invention. In this embodiment, the surface mount device 20C is similar to the invention set forth above with regards to FIG. 4. Thus, the surface mount device 20C includes a wafer 30, a bonding pad 40, a first passivation layer 50 having a top layer 52 and bottom layer 54, a light barrier layer 60, a second passivation layer 70, an under bump layer 80, and a solder bump 90. In accordance with this embodiment, the light barrier layer 60 is disposed between the top layer 52 and the bottom layer 54 of the first passivation layer 50. As should be appreciated, it may be difficult to maintain adhesion between the light barrier layer 60 and the second passivation layer 70, and therefore the top layer 52 is arranged to aid in the adhesion of the second passivation layer 70. That is, the top layer 52 is used to bind the second passivation layer 70 to the underlying layers.

The bonding pad 40 is disposed over select areas of the wafer surface 32. The bonding pad 40 is formed by depositing a conductive layer over the wafer surface 32 and then selectively etching the layer. As shown, the first passivation layer 50 is a combination of a bottom layer 54 and a top layer 52 that are arranged to sandwich the light barrier layer 60 therebetween. The bottom layer 54 is disposed over the wafer surface 32 and over a portion of the bonding pad 40. The bottom layer 54 is formed by depositing a suitable dielectric material over the wafer surface 32 and over the surface of the bonding pad 40 and then selectively etching the layer to form openings above the bonding pad 40. The openings are arranged to provide access to the bonding pad 40 through the bottom layer 54. In one implementation, the bottom layer 54 is a VOM layer having a thickness between about 5,000 angstroms and about 15,000 angstroms. It should be noted, however, that this is not a limitation and that the bottom layer 54 may be formed from other suitable materials.

The light barrier layer 60 is disposed over the bottom layer 54. The light barrier layer 60 is formed by depositing a suitable light blocking material over the surface of the bottom layer 54 and over the surface of the bonding pad 40 and selectively etching the layer to form light shield 62. As shown in FIG. 5, the light shield 62 is positioned so as to block ambient light from reaching light sensitive portions 36 of the integrated circuit. The light shield 62 includes an edge 64 arranged to extend over an outer edge 42 of the bonding pad 40 to prevent light from penetrating between the edges of the two layers. An opening is also formed in the light barrier layer 60 over the bonding pad 40 to provide access to the bonding pad 40 through the light barrier layer 60.

In this embodiment, the top layer 52 is disposed over the light barrier layer 60 and over a portion of the bottom layer 54. Thus, the light shield 62 is disposed between the bottom layer 54 and the top layer 52. The top layer 52 is formed by depositing a suitable dielectric material over the light barrier layer 60, over the bottom layer 54 and over the surface of the bonding pad 40 and then selectively etching the layer to form openings above the bonding pad 40. The openings are arranged to provide access to the bonding pad 40 through the top layer 52. In one implementation, the top layer 52 is a nitride layer having a thickness between about 5,000 angstroms and about 15,000 angstroms. It should be noted, however, that this is not a limitation and that the top layer 52 may be formed from other suitable materials.

To elaborate further, the second passivation layer 70 is disposed over the top layer 52. The second passivation layer 70 is formed by depositing a suitable dielectric material over the surface of the top layer 52 and then selectively etching the layer to form a resilient protective shield 72. Similarly to the top layer 52, an opening is formed in the second passivation layer 70 over the bonding pad 40 to provide access to the bonding pad 40 through the second passivation layer 70. Furthermore, the second passivation layer 70 is arranged to surround an edge 64 of the light shield 62. As mentioned, the second passivation layer 70 is arranged to protect the underlying layers from thermal, chemical, electrical and mechanical stresses. Moreover, the under bump layer 80 is at least disposed over the second passivation layer 70 and over the exposed portion of the bonding pad 40. As shown, the under bump layer 80 may also be disposed over a portion of the first passivation layer 50. The under bump layer 80 is formed by depositing a suitable conductive material over the surface of the second passivation layer 70 and over the surface of the bonding pad 40 and then selectively etching the layer to form under bump pad 82 on each bonding pad 40. As shown, under bump pad 82 may extend over a portion of the second passivation layer 70 to form a lip 84 around the corner of the opening. The lip 84 provides further protection against mechanical damage, as well as further protection against unwanted ambient light. Furthermore, a solder bump 90 is formed on the under bump pad 82 using conventional solder bumping or balling techniques. The solder bumps 90 are adapted to electrically couple the integrated circuit of the surface mount device 20 to an external substrate such as a printed circuit board. As should be appreciated, solder bump 90, under bump pad 82, and bonding pad 40 form electrical terminal 90A.

In accordance with another embodiment of the present invention, the light shield is electrically grounded to prevent the formation of an electrical potential at the light shield. As should be appreciated, if the light shield is formed from a conductive material, then the light shield may randomly pick up electrical signals, which may adversely effect the functioning of the underlying integrated circuit. Accordingly, in order to control the electrical potential, the conductive light shield is electrically coupled to a ground source.

Figure 6:
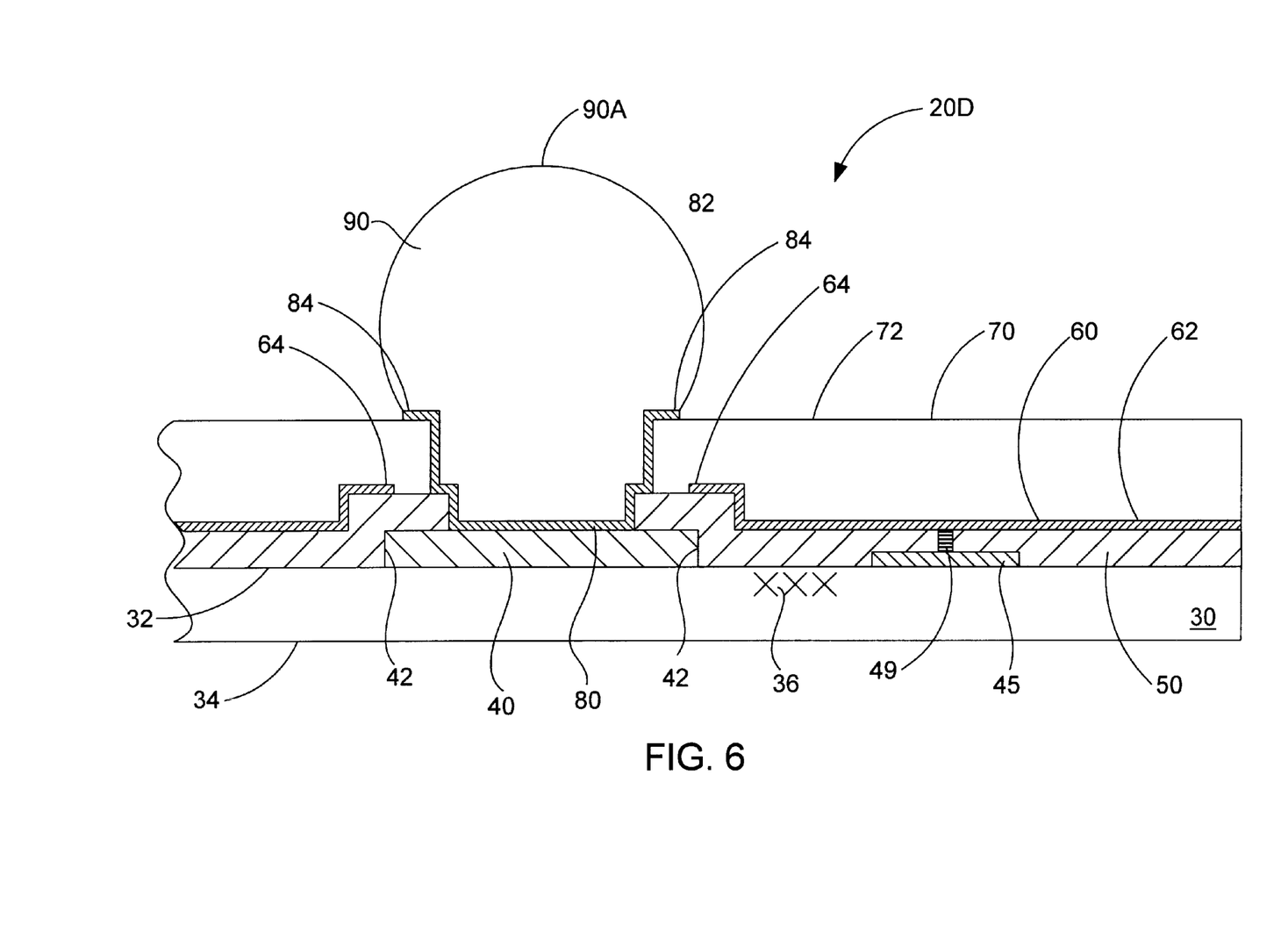
FIG. 6 is a side elevation view, in cross section (taken along 2–2' as indicated in FIG. 1), of the surface mount device, in accordance with one embodiment of the present invention.

Referring to FIG. 6, a surface mount device 20D similar to the invention set forth above with regards to FIGS. 1–3 is shown. Thus, the surface mount device 20D includes a wafer 30, a bonding pad 40, a first passivation layer 50, a light barrier layer 60, a second passivation layer 70, an under bump layer 80, and a solder bump 90. In addition, the surface mount device 20 includes a ground metal trace 45. The bonding pad 40 and the ground metal trace 45 are shown disposed over select areas of the wafer 30. The bonding pad 40 is a portion of a deposited conductive layer that is coupled to the integrated circuit, and the ground metal trace 45 is a portion of a deposited conductive layer that is coupled to a ground source (not shown). Both the bonding pad 40 and the ground metal trace 45 are formed by depositing a conductive layer over the wafer surface 32 and then selectively etching the layer. The first passivation layer is disposed over a portion of the bonding pad 40, over a portion of the ground metal trace 45 and over the wafer surface 32. The first passivation layer 50 is formed by depositing a suitable dielectric material over the wafer 30, over the ground metal trace 45 and over the bonding pad 40 and then selectively etching the layer to form a first opening over the bonding pad 40 and a second opening over the metal trace 45. A suitable conductive material is subsequently formed inside the second opening in order to provide an electrical connection 49 between the ground trace 45 and the light barrier layer 60. By way of example, materials such as Al, TiW, and TiN may be used to form electrical connection 49.

Furthermore, the light barrier layer 60 is disposed over the first passivation layer 50 and over the electrical connection 49. The light barrier layer 60 is formed by depositing a suitable light blocking material over a portion of the bonding pad 40, the first passivation layer 50, and the electrical connection 49 and then selectively etching the layer to form light shield 62. In one embodiment, the light shield 62 is formed from a conductive material. The light shield 62 is positioned so as to block ambient light from reaching light sensitive portions 36 of the integrated circuit, and is electrically coupled to the metal trace 45 through the electrical connection 49. An opening is also formed in the light barrier layer 60 over the bonding pad 40 to provide access to the bonding pad 40 through the light barrier layer 60. Moreover, the second passivation layer 70 is disposed over the light shield 62 and over a portion of the first passivation layer 50. The second passivation layer 70 is formed by depositing a suitable dielectric material having resilient qualities over the light shield 62, over the first passsivation layer 50, and over the bonding pad 40 and then selectively etching the layer to form a resilient protective shield 72. An opening is also formed in the second passivation layer 70, exposing again the surface of bonding pad 40.

Additionally, the under bump layer 80 is disposed at least over the second passivation layer and over the exposed portion of the bonding pad 40. As shown, the under bump layer 80 may also be disposed over a portion of the first passivation layer 50. The under bump layer 80 is formed by depositing a suitable conductive material over the surface of the second passivation layer 70 and over the surface of the bonding pad 40, and then selectively etching the layer to form under bump pad 82 on each bonding pad 40. Furthermore, a solder bump 90 is formed on the under bump pad 82 using conventional solder bumping or balling techniques The solder bumps 90 are adapted to electrically couple the integrated circuit of the surface mount device 20 to an external substrate such as a printed circuit board. As should be appreciated, solder bump 90, under bump pad 82, and bonding pad 40 form electrical terminal 90A.

Although the grounded light shield was described and shown in accordance with the layers of FIGS. 1–3, it should be noted that the grounded light shield may also be produced in accordance with the teachings of the invention set forth above with regards to FIGS. 4 & 5. For example, an electrical connection can be formed through both the top and/or bottom layers of the first passivation layer.

In accordance with another embodiment of the present invention, the light shield is arranged to cover and surround the outer edge of the first passivation layer to block light from entering through the sides of the first passivation layer. For example, if the edge of the first passivation layer is not covered, then ambient light may reach the light sensitive portions of the integrated circuit by passing through the first passivation layer. Accordingly, the edge of the light shield is arranged to extend around and over the outer edge of the first passivation layer. This embodiment is particularly advantageous to further prevent light from entering the light sensitive portions of the integrated circuit. That is, the overlap effectively reduces light from entering through the sides of the first passivation layer.

Figure 7A:
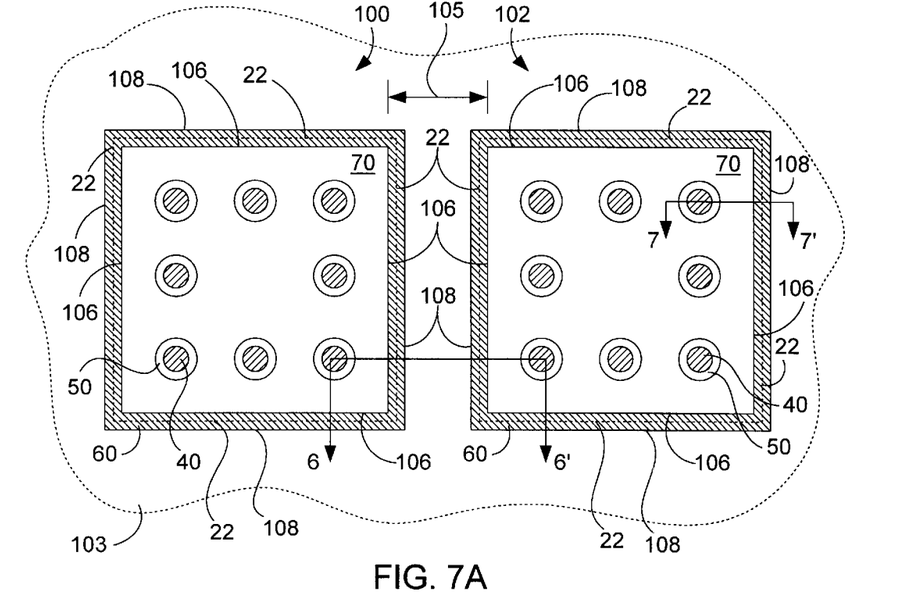
FIG. 7A is a plan view of a portion of wafer having a pair of surface mount devices formed thereon, in accordance with one embodiment of the present invention.
Figure 7B:
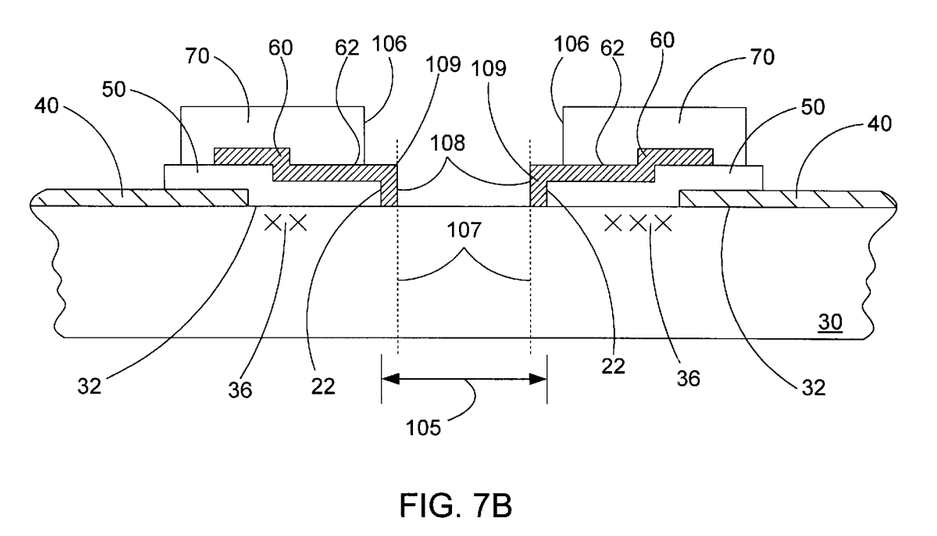
FIG. 7B is side elevation view, in cross section, of the surface mount devices of FIG. 7A, in accordance with one embodiment of the present invention.

Referring to FIGS. 7A & 7B, a pair of dies 100 and 102 are shown adjacent one another on a portion 103 of a wafer. For ease of discussion, the under bump pad and the solder bump are not illustrated in FIGS. 7A & B. Each of these dies 100, 102 represents a die that would be cut from the wafer to form a surface mount device (for example, any one of the surface mount device as shown in FIGS. 1–6) including a wafer 30, a bonding pad 40, a passivation layer 50, which may be a single layer or a combination of layers, a light barrier layer 60, and a second passivation layer 70. As shown, the passivation layer 50 forms a first outer peripheral edge 22, the second passivation layer 70 forms a second outer peripheral edge 106, and the light barrier layer 60 forms a third outer peripheral edge 108. The second outer peripheral edge 106 extends to a point inside of the first outer peripheral edge 22, while the third outer peripheral edge 108 extends to a point outside of the first outer peripheral edge 22. Although the second peripheral edge 106 is shown extending inside the first outer peripheral edge 22, it should be noted that this is not a limitation and that its position may vary according to the specific design of each surface mount device. For example, the second outer peripheral edge 106 may extend to about the same position as the first outer peripheral edge 22. As shown, a space or saw street 105 is provided between the outer peripheral edges 22 of adjacent dies. The saw street 105 is the area of the wafer used for cutting and separating the dies 100, 102.

Referring to FIG. 7B, the light barrier layer 60 is disposed not only over the first passivation layer 50, but also over the wafer surface 32. In this embodiment, the light barrier layer 60 is formed by depositing a suitable light blocking material over the surface of the first passivation layer 50, over the surface of the bonding pad 40 and over the surface of the wafer 30 and selectively etching the layer to form light shield 62. As shown in FIG. 7B, the light shield 62 is positioned so as to block ambient light from reaching light sensitive portions 36 of the integrated circuit. Similarly to the descriptions above, a first opening is formed in the light barrier layer 60 over the bonding pad 40 to provide access to the bonding pad 40 through the light barrier layer 60. In addition, a second opening is formed in the light barrier layer 60 over the wafer 30 to provide access to the wafer surface 32, and more particularly, to a sawable area 107. The sawable area 107 is generally defined as the area where the wafer 30 is cut. In most cases, the sawable area 107 is smaller than the saw street 105. In one embodiment, the sawable area 107 is positioned between adjacent third outer peripheral edges 108 in order to ensure that the light barrier shield 62 is not damaged during cutting.

To elaborate further, the light shield 62 is arranged to extend past and around the outer peripheral edge 22 of the first passivation layer 50 to the wafer surface 32 (and into the saw street 105). Thus, the light shield 62 includes an edge portion 109 arranged to cover the outer peripheral edge 22 of the passivation layer 50. As such, the light shield 62 not only prevents light from entering the wafer surface 32, but also prevents light from passing through the outer peripheral edge 22 of the passivation layer 50. That is, the edge portion 109 effectively blocks light from entering through the sides of the passivation layer 50.

Figure 7C:
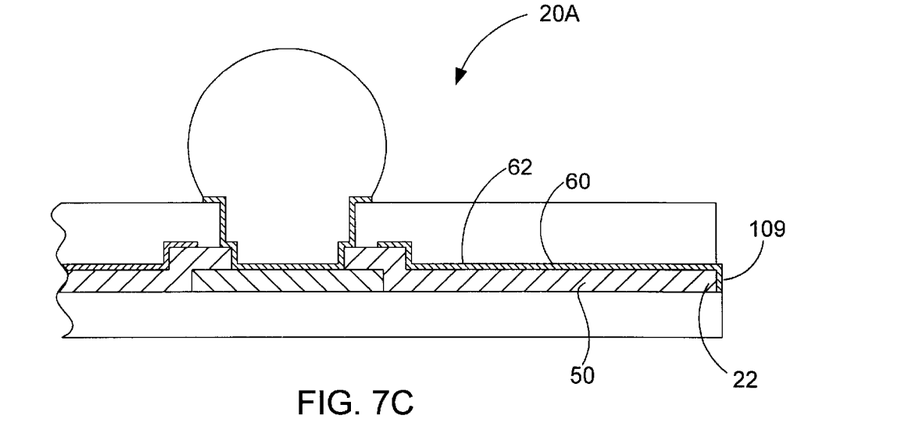
FIG. 7C is side elevation view, in cross section (taken along 7–7' as indicated in FIG. 7A) of the surface mount device, in accordance with one embodiment of the present invention.
Figure 7D:
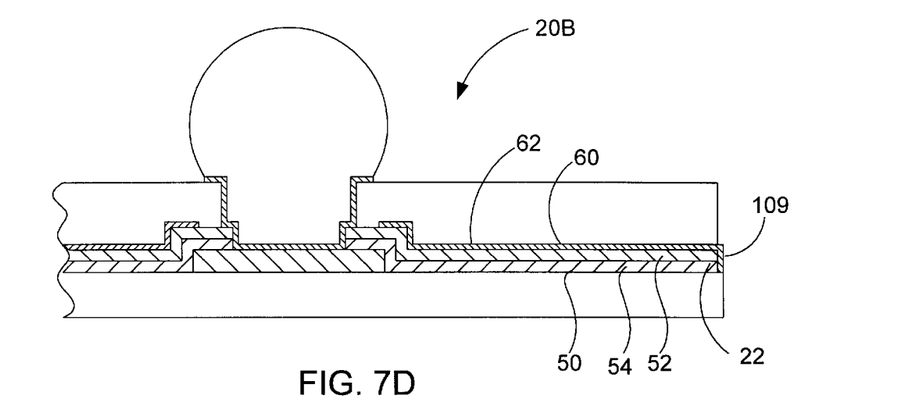
FIG. 7D is side elevation view, in cross section (taken along 7–7' as indicated in FIG. 7A) of the surface mount device, in accordance with one embodiment of the present invention.
Figure 7E:
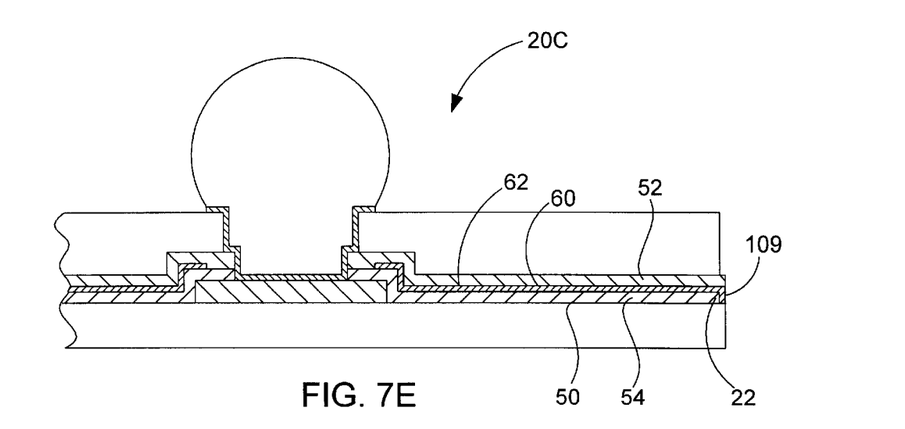
FIG. 7E is side elevation view, in cross section (taken along 7–7' as indicated in FIG. 7A) of the surface mount device, in accordance with one embodiment of the present invention.

It should be noted that the above description may be produced in accordance with the teachings of the invention set forth above with regard to FIGS. 1–6. Accordingly, FIGS. 7C–7E show various embodiments of the present invention that may include the edge portion 109 of the light barrier layer 60. For example, FIG. 7C shows the surface mount device 20A including a light shield 62 covering the outer peripheral edge 22 of a single passivation layer 50. FIG. 7D shows the surface mount device 20B including a light shield 62 covering the outer peripheral edge 22 of the first passivation layer 50, which includes a top layer 52 and a bottom layer 54. FIG. 7E shows the surface mount device 20C including a light shield 62 covering the outer peripheral edge 22 of the bottom layer 54 of the first passivation layer 50.

Figure 8:
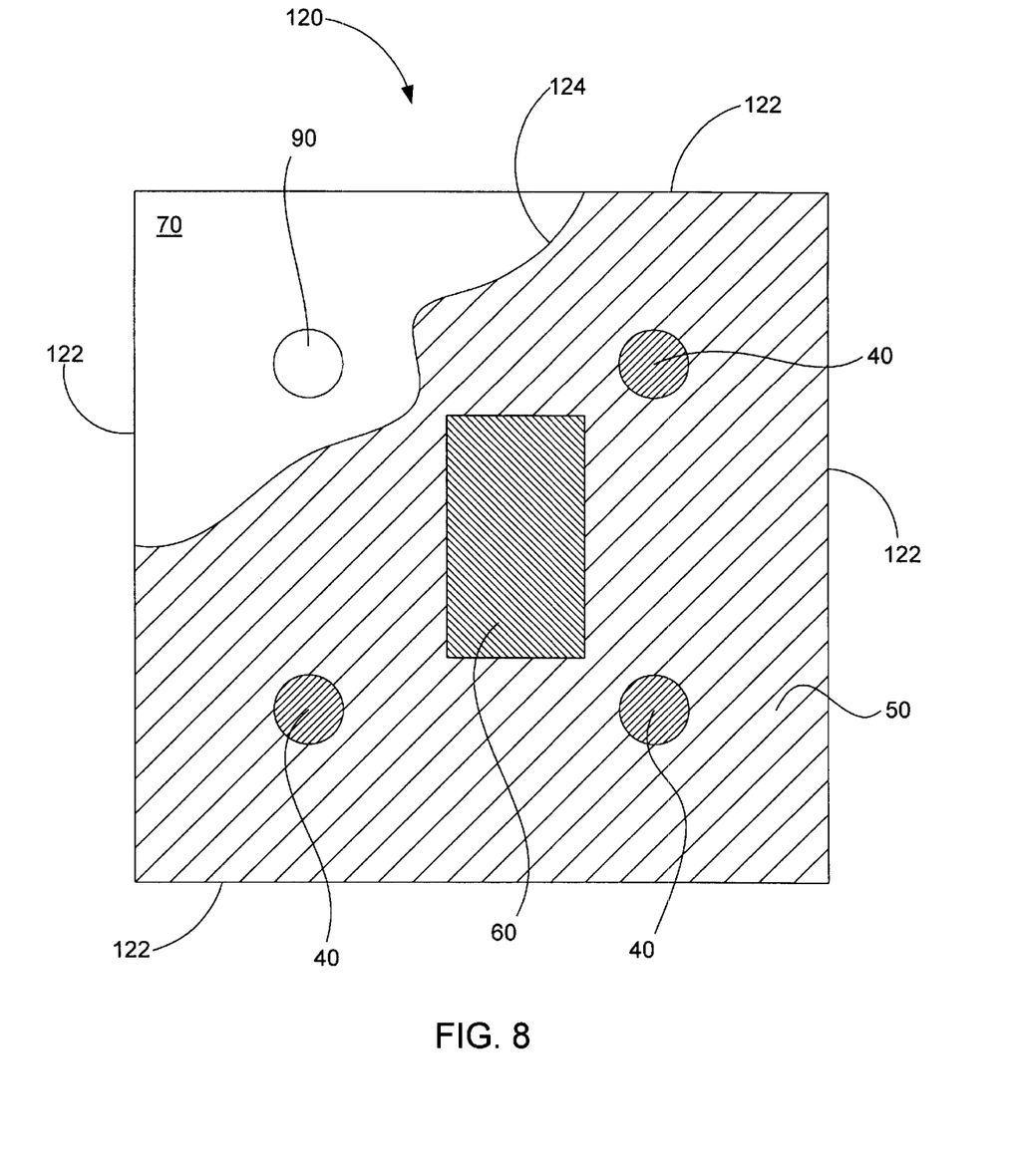
FIG. 8 is a plan view of a surface mount device, in accordance with one embodiment of the present invention.

FIG. 8 is a plan view of the top surface of a surface mount device 120, in accordance with an alternate embodiment of the present invention. The surface mount device 120 is shown after it has been cut from a semiconductor wafer (not shown). The surface mount device 120 typically has an outer peripheral edge 122. The surface mount device 120 generally includes a plurality solder bumps 90 and a resilient outer coating 70. The solder bumps 90 are adapted to electrically couple the integrated circuit of the surface mount device 120 to an external substrate such as a printed circuit board. The resilient outer coating 70, which extends to about the outer peripheral edge 122 of the surface mount device, is adapted to protect the underlying layers of the surface mount device 20 from chemical, mechanical, electrical, and thermal stresses.

As shown, a portion 124 of the surface mount device 120, including a portion of the resilient outer coating and a plurality of solder bumps, has been removed in order to show the underlying layers of the surface mount device 120. Some of the underlying layers include a bonding pad 40, a passivation layer 50 and a light barrier layer 60. The light barrier layer 60, which is disposed between the resilient outer coating 70 and the passivation layer 50, is arranged to cover a portion of the surface mount device 20. The light barrier layer 60 is arranged to form a light shield that blocks light from reaching light sensitive portions of the underlying integrated circuit. FIG. 8 should be compared with FIG. 1. In FIG. 1, the light barrier layer 60 covers almost all of the surface of the surface mount device 20 apart from the openings above the bonding pad 40, whereas in FIG. 8 the light barrier layer 60 covers a much smaller portion of the surface of the surface mount device 120. The configuration shown in FIG. 8 is appropriate when the light sensitive portions of the IC are confined to a smaller region of the die.

Materials other than those named in the aforementioned embodiments can be used in each of the parts enumerated in FIGS. 1–8, while remaining within the scope of the present invention. For example, the wafer 30 may be a wafer of any suitable material, including any suitable semiconductor material. Bonding pad 40 may be formed of any suitable conductive material such as aluminum, copper, aluminum-copper, aluminum-silicon, aluminum-copper-silicon and/or the like. The first passivation layer 50 may be formed of any suitable dielectric material such as VOM and/or nitride and/or the like. The light barrier layer 60 may be formed of any suitable light blocking material such as aluminum, titanium, titanium-tungsten, titanium nitride and the like. The second passivation layer 70 may be formed of any resilient material such as polyimide and/or benzocyclobutene and the like. The under bump layer 80 may be formed of any suitable conductive material that provides good adhesion between the bonding pad 40 and the solder bump 90, and may include a plurality of layers. By way of example, materials such as aluminum, nickel, nickel-vanadium, copper, chromium, copper-chromium may be used.

Furthermore, the aforementioned layers are formed using conventional fabrication techniques. For example, the patterned layers are formed using well known photolithography techniques. Patterning is typically accomplished by depositing a photoresist layer over the layer to be patterned, and then selectively exposing the photoresist to light through a patterned reticle. Once exposed, the photoresist is developed to form a photoresist mask that is used in etching layers that are exposed and not covered by the photoresist material.

As can be seen from the foregoing, the advantages of the light shield are numerous. Different embodiments or implementations may have one or more of the following advantages. One advantage of the light shield is that ambient light is blocked from entering the surface of the die and from entering the dielectric wall on the sides of the die. As a result, the surface mount device can achieve optimal performance without the adverse effects of light. Another advantage of the present invention is that it uses current fab processing and is a low cost solution. Yet another advantage of the present invention is that it provides a universal solution, which can be applied to many different fab technologies. By way of example, some technologies include CMOS, Bipolar, BiCMOS and the like.

While this invention has been described in terms of several preferred embodiments, there are alterations, permutations, and equivalents, which fall within the scope of this invention. For example, although the present invention was described as having one integrally formed light barrier layer, it should be understood that this is not a limitation and that a plurality of separated layers may be used to block ambient light. It should also be noted that there are many alternative ways of implementing the methods and apparatuses of the present invention. That is, although the invention has been primarily described in the context of a surface mount device, it should be appreciated that the invention can readily be used in a wide variety of other integrated circuit devices, for example a flip chip. It should also be appreciated that any number of solder bumps may be used with the present invention. Furthermore, it should be noted that an underfill layer may be used along with the present invention to provide further protection against stress. It is therefore intended that the following appended claims be interpreted as including all such alterations, permutations, and equivalents as fall within the true spirit and scope of the present invention.

What is claimed is:

1. An un-encapsulated integrated circuit package, comprising:

a substrate including a substrate surface having active portions of an integrated circuit formed thereon, the active portions of the integrated circuit including light sensitive areas;

a bonding pad disposed over the substrate surface; and a light shield disposed over a portion of the bonding pad and over a portion of the substrate surface that includes at least the light sensitive areas of the active portions, the light shield being opaque to ambient light;

a first passivation layer disposed between the light shield and the substrate surface and between the light shield and the bonding pad;

a second passivation layer disposed over the light shield, wherein the first passivation layer, the light shield, and the second passivation layer define an opening above the bonding pad;

an under bump pad disposed on the bonding pad, the under bump pad being arranged to extend over a top portion of the second passivation layer and to cover the inner side surfaces of the first and second passivation layers; and a solder bump disposed on the under bump pad, wherein the bonding pad, the under bump pad and the solder bump form an electrical terminal, the electrical terminal being adapted to electrically couple the integrated circuit of the integrated circuit package to an external substrate.

2. The integrated circuit package as recited in claim 1 wherein an edge of the light shield extends over an edge of the bonding pad.

3. The integrated circuit package as recited in claim 1 further including a third passivation layer disposed between the light shield and the second passivation layer, wherein the first passivation layer, the light shield, the second passivation layer and the third passivation layer define an opening above the bonding pad.

4. The integrated circuit package as recited in claim 1 wherein the first passivation layer includes an outer side portion, and wherein the light shield is arranged to extend over the outer side portion.

5. The integrated circuit package as recited in claim 1 further including a third passivation layer disposed between the first passivation layer and the light shield, wherein the first passivation layer, the light shield, the second passivation layer and the third passivation layer define an opening above the bonding pad.

6. The integrated circuit package as recited in claim 5 wherein the third passivation layer is formed from a nitride layer, and wherein the first passivation layer is formed from a vapox over metal layer.

7. The integrated circuit package as recited in claim 1 wherein the second passivation layer is formed from a different material than the first passivation layer.

8. The integrated circuit package as recited in claim 1 wherein the second passivation layer is formed from a resilient coating.

9. The integrated circuit package as recited in claim 8 wherein the second passivation layer is formed from benzocyclobutene.

10. The integrated circuit package as recited in claim 8 wherein the second passivation layer is formed from polyimide.

11. The integrated circuit package as recited in claim 1 wherein the light barrier layer is formed from a non-conductive material.

12. The integrated circuit package as recited in claim 1 wherein the light barrier layer is formed from a conductive material.

13. The integrated circuit package as recited in claim 12 wherein the light shield is electrically floating.

14. The integrated circuit package as recited in claim 12 wherein the light shield is electrically grounded.

15. The integrated circuit package as recited in claim 1 wherein the light shield is formed from Al.

16. The integrated circuit package as recited in claim 1 wherein the integrated circuit package is a flip chip.

17. The integrated circuit package as recited in claim 1 wherein the integrated circuit package is an un-encapsulated integrated circuit package.

18. The integrated circuit package as recited in claim 1 wherein the first passivation layer has a top layer and a bottom layer, the light shield being disposed over the top layer and the bottom layer.

19. The integrated circuit package as recited in claim 18 wherein the top layer is formed from a nitride layer, and wherein the bottom layer is formed from a vapox over metal layer.

20. The integrated circuit package as recited in claim 1 wherein the light shield is formed from Ti.

21. The integrated circuit package as recited in claim 1 wherein the light shield is formed from TiW.

22. The integrated circuit package as recited in claim 1 wherein the light shield is formed from TiN.

23. The integrated circuit package as recited in claim 1 wherein the under bump pad is formed from Al.

24. The integrated circuit package as recited in claim 1 wherein the under bump pad is formed from nickel, nickel-vanadium, copper, chromium or copper-chromium.

25. The integrated circuit package as recited in claim 1 wherein the under bump pad is formed from a different material than the bonding pad.

26. The integrated circuit package as recited in claim 1 wherein the active portions of the integrated circuit include transistors, interconnects, capacitors, or resistors.

27. The integrated circuit package as recited in claim 1 wherein the first passivation layer serves to protect the underlying structures of the integrated circuit and the second passivation layer serves to protect the underlying layers from thermal, chemical, electrical or mechanical stresses associated with attaching the solder bump to the external substrate.

28. An integrated circuit package, comprising:

a substrate including a substrate surface having active portions formed thereon, the active portions including light sensitive areas;

a bonding pad disposed over the substrate surface;

a light shield disposed over a portion of the bonding pad and over a portion of the substrate surface that includes at least the light sensitive areas of the active portions, the light shield being opaque to ambient light;

a first passivation layer disposed between the light shield and the substrate surface and between the light shield and the portion of the bonding pad; and a second passivation layer disposed over the light shield, wherein the second passivation layer is formed from a different material than the first passivation layer.

29. The integrated circuit package as recited in claim 28 wherein the first passivation layer serves to protect the underlying structures of the integrated circuit and the second passivation layer serves to protect the underlying layers from thermal, chemical, electrical or mechanical stresses.

30. An integrated circuit package, comprising:

a passivation layer capable of transmitting light therethrough, the passivation layer having a top surface, an inner side surface and an outer side surface, the inner side surface defining an opening for providing access to a bonding pad, the passivation layer partially covering the bonding pad such that a portion of the passivation layer proximate the inner side surface of the passivation layer is disposed over the bonding pad; and a light shield capable of blocking the passage of light and covering the top and outer side surfaces of the passivation layer, the light shield being partially disposed over the bonding pad proximate the inner side surface of the passivation layer, the light shield being configured to prevent light from reaching light sensitive areas of an integrated circuit through the top, inner side surface and outer side surface of the passivation layer.

31. A flip chip, comprising:

a substrate including a substrate surface having active portions formed thereon;

a bonding pad disposed over a portion of the substrate surface, the bonding pad being formed from a first material;

a first passivation layer disposed over a portion of the substrate surface;

a second passivation layer disposed over the first passivation layer;

a light barrier layer disposed between the first passivation layer and the second passivation layer, the light barrier being opaque to ambient light and arranged to cover at least the active portions formed on the substrate, the light barrier layer being formed from a second material, wherein the first material is different than the second material.

32. A method of forming an un-encapsulated flip chip that is protected from ambient light, comprising:

providing a substrate having a plurality of layers formed thereon, the plurality of layers including at least a bonding pad and a passivation layer, the passivation layer defining an opening above the bonding pad;

forming a light barrier layer over the passivation layer, the light barrier being configured to provide access to the bonding pad through a second opening, the light barrier layer being opaque to ambient light;

forming a second passivation layer over the light barrier layer and over the first passivation layer, the second passivation layer being configured to provide access to the bonding pad through a third opening;

forming an under bump layer over the bonding pad and over the second passivation layer; and forming a solder bump on the under bump layer.

33. The method as recited in claim 32 wherein the light barrier layer is formed over a portion of the bonding pad.

34. The method as recited in claim 32 wherein providing a substrate having a plurality of layers formed thereon comprises:

providing a substrate with a first region and a second region;

forming a bonding pad over the first region of the substrate;

forming a passivation layer over the second region of the substrate and over a first portion of the first region.

35. The method as recited in claim 34 wherein the light barrier layer is positioned over the second region and a second portion of the first region.

36. The method as recited in claim 35 wherein the bonding pad is formed by depositing a conductive material on the surface of the substrate and then selectively etching the conductive material, wherein the passivation layer is formed by depositing a dielectric material on the surface of the substrate and on the surface of the bonding pad and then selectively etching the dielectric material to form the first opening above the bonding pad, and wherein the light barrier layer is formed by depositing a light blocking material on the surface of the passivation layer and then selectively etching the light blocking material to form a light shield that includes the second opening above the bonding pad.

37. The method as recited in claim 36 wherein the second passivation layer is formed by depositing a dielectric material on the surface of the light barrier layer and on the surface of the first passivation layer and then selectively etching the dielectric material to form a third opening above the bonding pad.

38. The device as recited in claim 31 wherein the second passivation layer is formed from a different material than the first passivation layer.

39. The device as recited in claim 31 wherein the first passivation layer, the light shield, and the second passivation layer define an opening above the bonding pad.

40. The device as recited in claim 31 further including an under bump pad disposed on the bonding pad and a solder bump disposed on the under bump pad, wherein the bonding pad, the under bump pad and the solder bump form an electrical terminal, the electrical terminal being adapted to electrically couple an integrated circuit of the surface mount device to an external substrate.

41. An integrated circuit package, comprising:

a substrate having a first region and a second region;

a bonding pad disposed over the first region of the substrate;

a light shield disposed over the second region of the substrate, the light shield being configured to block light from reaching the second region; and a passivation layer disposed between the light shield and the substrate and between the light shield and the bonding pad, the passivation layer having an outer side, and wherein the light shield is configured to cover the outer side so as to prevent the passage of light through the outer side of the passivation layer.

42. The package as recited in claim 41 wherein the light shield is also disposed over the bonding pad, and wherein the light shield has an opening so as to provide access to the bonding pad through the light shield.

43. The package as recited in claim 42 wherein an inner edge of the opening of the light shield is arranged to overlap an outer edge of the bonding pad so as to prevent the passage of light between the light shield and the bonding pad.

44. The package as recited in claim 41 wherein the bonding pad is formed from a first material and wherein the light shield is formed from a second material that is different than the first material.

45. The integrated circuit package as recited in claim 41 wherein the first and second regions represent different areas of the substrate.

46. The integrated circuit package as recited in claim 41 wherein the passivation layer and the light shield having an inner side that defines an opening above the bonding pad.

47. The integrated circuit package as recited in claim 46 further including a second passivation layer disposed over the light shield and covering the inner side of the light shield.

* * * * *